United States Patent
Oda (10) Patent No.: US 6,531,779 B1
(45) Date of Patent: Mar. 11, 2003

(54) MULTI-LAYER INTERCONNECTION STRUCTURE IN SEMICONDUCTOR DEVICE AND METHOD FOR FABRICATING SAME

(75) Inventor: Noriaki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/605,838

(22) Filed: Jun. 29, 2000

(30) Foreign Application Priority Data

Jun. 29, 1999 (JP) .......................................... 11-183285

(51) Int. Cl.[7] .............................................. H01L 23/52
(52) U.S. Cl. ...................... 257/758; 257/354; 257/401; 257/409
(58) Field of Search .......................... 257/758, 48, 170, 257/354, 401, 409, 773; 438/227, 183, 231

(56) References Cited

U.S. PATENT DOCUMENTS 6,242,811 B1 * 6/2001 Chen ........................... 257/765
6,252,290 B1 * 6/2001 Quek ........................... 257/522
6,255,186 B1 * 6/2001 Al-Shareef ................... 438/396
6,259,115 B1 * 7/2001 You ............................. 257/48
6,259,160 B1 * 7/2001 Lopatin ....................... 257/762

FOREIGN PATENT DOCUMENTS

JP 404162650 A * 6/1992
JP 8-293551 11/1996

* cited by examiner

Primary Examiner—Olik Chaudhuri
Assistant Examiner—Nathan W. Ha
(74) Attorney, Agent, or Firm—McGinn & Gibb, PLLC (57) ABSTRACT

A semiconductor device having a multi-layer interconnection structure including bottom interconnects and top interconnects including a first top interconnect having a maximum thickness and a second top interconnect having a thickness thinner than that of the first top interconnect. Thereby, optimization of the parasitic capacitance and the parasitic resistance depending on the demand on the circuit operation and the interconnect length can be attained.

11 Claims, 9 Drawing Sheets

MULTI-LAYER INTERCONNECTION STRUCTURE IN SEMICONDUCTOR DEVICE AND METHOD FOR FABRICATING SAME

BACKGROUND OF THE INVENTION (a) Field of the Invention

The present invention relates to a multi-layer interconnection structure in a semiconductor device and a method for fabricating the same, and more in detail, to the multi-layer interconnection structure including a plurality of interconnects having different interconnect film thicknesses in a single interconnect layer in which a parasitic capacitance and a parasitic resistance can be best established depending on demands on a circuit operation and an interconnect length, and the method for fabricating the same.

(b) Description of the Related Art

With higher integration and miniaturization of a semiconductor device, interconnects for connecting respective regions of a semiconductor element are multi-layer to reduce a surface area required for interconnects in the interconnect design of the semiconductor device because miniaturization of the respective semiconductor elements are more and more requested.

The semiconductor device is configured as a large-scale integrated circuit having a significant number of electronic circuits including semiconductor elements having a variety of functions.

The interconnects of the semiconductor device are composed as a collective member for connecting the respective semiconductor elements. The interconnects include a long-distance interconnect for connecting the semiconductor elements disposed relatively far from each other, a medium-distance interconnect for connecting those disposed in a relatively short distance and a short-distance interconnect for connecting regions in a single semiconductor element.

The interconnects in the semiconductor device have a variety of properties depending on the film thickness and the length thereof.

Figure 1:
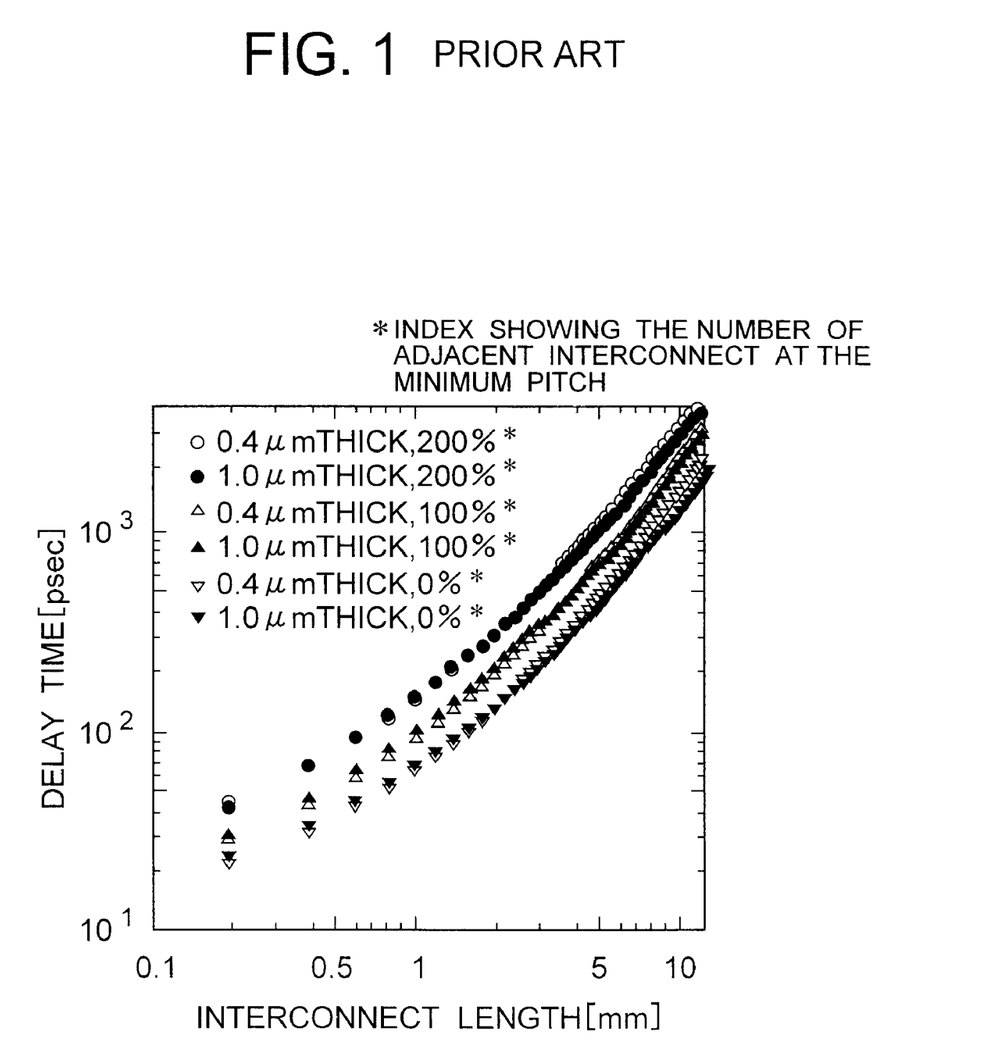
FIG. 1 is a graph showing relations between interconnect lengths and delay times taking interconnect thicknesses as parameters.

For example, a delay time with respect to a specified interconnect length was measured, with the film thickness as a parameter, for a CMOS semiconductor having gate widths of 10 μm and 20 μm for the N-channel transistor and the P-channel transistor, respectively, an interconnect width of 0.3 μm and an interconnect interval of 0.3 μm, that is, an interconnect pitch of 0.6 μm. The results of the measurements were as shown in FIG. 1.

If the interconnect length is longer than a critical length, the delay time is longer for the interconnect having a thinner film thickness. Conversely, if the interconnect length is shorter than the critical length, the delay time is basically longer for the interconnect having a thicker film thickness.

Parasitic capacitances (pF/mm) for the interconnect having a thicker film thickness (0.4 μm thickness) and the interconnect having a thinner film thickness (1.0 μm thickness) are as shown in Table 1 by employing an index showing the number of adjacent interconnects running parallel to the subject interconnect at the minimum pitch therefrom as a parameter. The parasitic resistance is 158 Ω/mm for the interconnect having a film thickness of 0.4 μm, and 63 Ω/mm for the interconnect having a film thickness of 1.0 μm.

TABLE 1

|  | 200% | 100% | 0% |
| --- | --- | --- | --- |
| 0.4 μm thickness | 0.23 | 0.18 | 0.13 |
| 1.0 μm thickness | 0.39 | 0.30 | 0.18 |

The above index is defined as follows. If two interconnects extend parallel to the subject interconnect with a minimum pitch at both sides thereof, the index is 200%. If a single interconnect extends parallel to the subject interconnect with the minimum pitch at either side thereof, it is 100%. If no interconnect extends parallel to the subject interconnect, it is 0%.

If the line widths of the interconnects in the semiconductor device are set substantially the same, a relatively large thickness is necessary for a longer-distance interconnect and a relatively small thickness is sufficient for a shorter-distance interconnect.

The interconnect constituting a critical path for the circuit operation is required to be relatively thick, and that not constituting the critical path may be relatively thin. The term "critical path" used herein is the path of an interconnect which determines the speed of operation in a chip.

Optimization of the parasitic capacitance and the parasitic resistance is required depending on the demand on the circuit operation and the interconnect length, otherwise the circuit operation is delayed.

When the short-distance interconnect and the long-distance interconnect are present in a single interconnect layer in a multi-layer structure, the film thicknesses of the two interconnects are substantially the same because they are formed in the same interconnect forming step.

In the step for forming, the optimization of the parasitic capacitance and the parasitic resistance cannot be implemented, thereby delaying the circuit operation As an alternative process for the optimization, the layer for the short-distance interconnect and the layer for the long-distance interconnect are separately deposited and the optimization is implemented in the respective layers. In this manner, the parasitic capacitance and the parasitic resistance can be optimized in each of the interconnect layers. However, the number of the steps increases to elevate the manufacturing cost due to the layer increase, and further the interconnection structure becomes larger to be against the miniaturization of the semiconductor device.

JP-A-8(1996)-293551 describes a conventional method for forming a multi-layer interconnection structure in which top layer interconnects has a film thickness different from that of the bottom interconnect.

Referring to FIGS. 2A to 2F, the conventional method for forming the multi-layer interconnection structure described in the publication will be described.

Figure 2A:
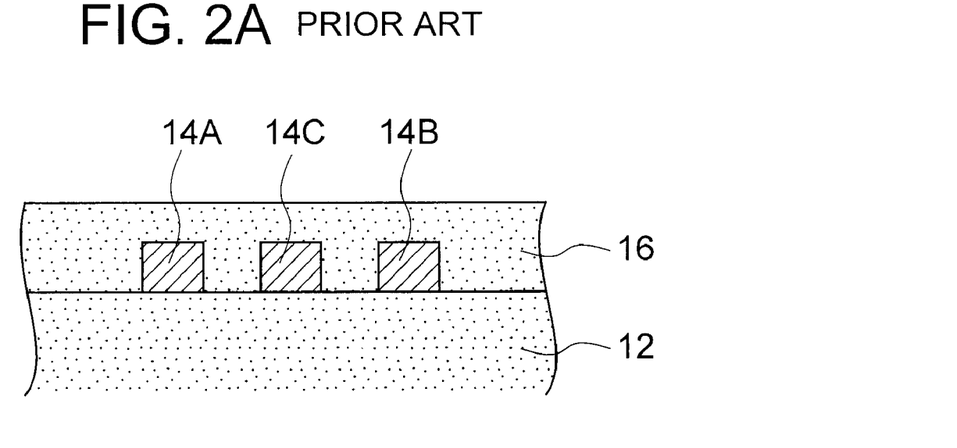
FIGS. 2A to 2F are longitudinal sectional views sequentially showing a conventional method for manufacturing a semiconductor device including a plurality of interconnects having different thicknesses.

At first, as shown in FIG. 2A, bottom interconnects 14A, 14B and 14C having substantially the same film thickness are formed on a dielectric film 12, and a first interlayer dielectric film 16 is deposited on the bottom interconnects.

The bottom interconnects 14A and 14B have small distances and have a small thickness, whereas the bottom interconnect 14C is required to be thick, which forms a lower layer of a bottom interconnect 26 (FIG. 2C) formed as the long-distance interconnect. The thickness of the first interlayer dielectric film 16 is substantially the same as that of the bottom interconnect 26.

Figure 2B:
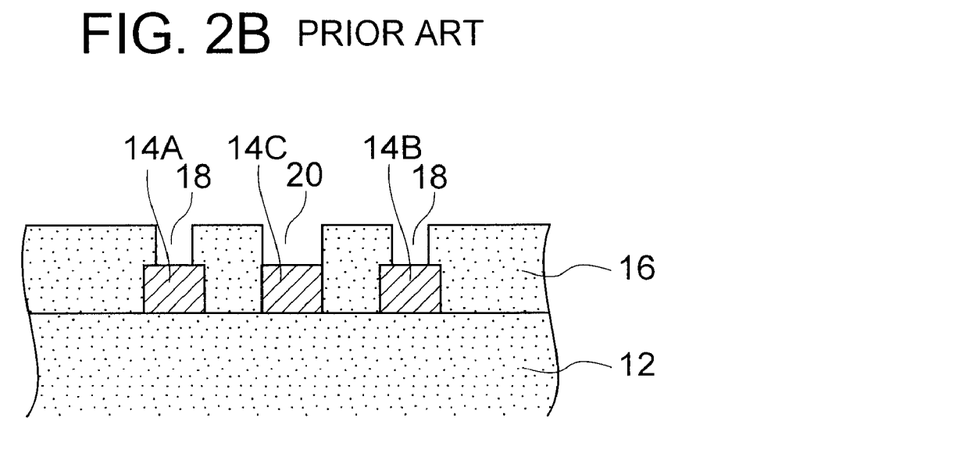

Then, as shown in FIG. 2B, the first interlayer dielectric film 16 is etched to form via-holes 18 reaching to the bottom interconnects 14A and 14B, and an interconnect trench 20, on the bottom interconnect 14C, having the substantially same width as that of the bottom interconnect 14C.

Figure 2C:
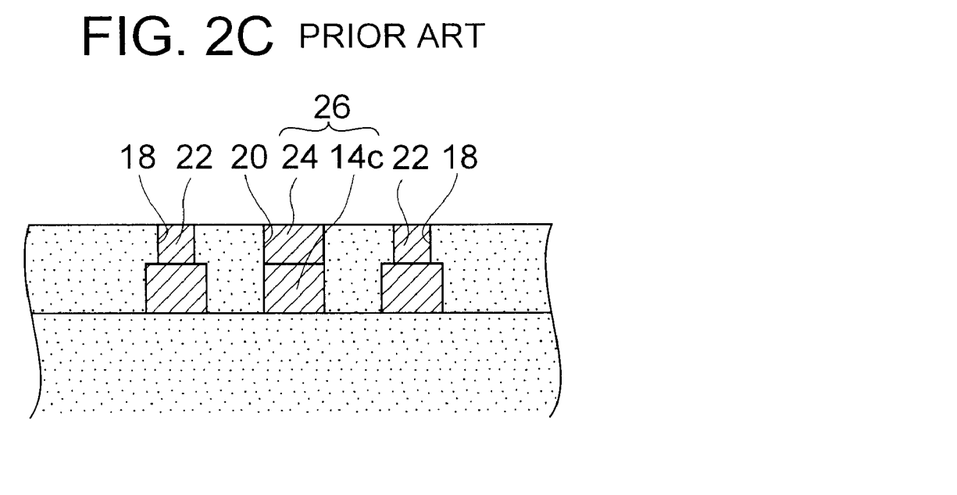

Further, as shown in FIG. 2C, the via-holes 18 and the interconnect trench 20 are filled with the interconnect material the same as that of the bottom interconnects 14A to 14C to form via-holes 22 and an upper layer 24 of the bottom interconnect 26, respectively. The thickness of the bottom interconnect 26 is a sum of those of the bottom interconnect 14C and the upper layer 24.

Figure 2D:
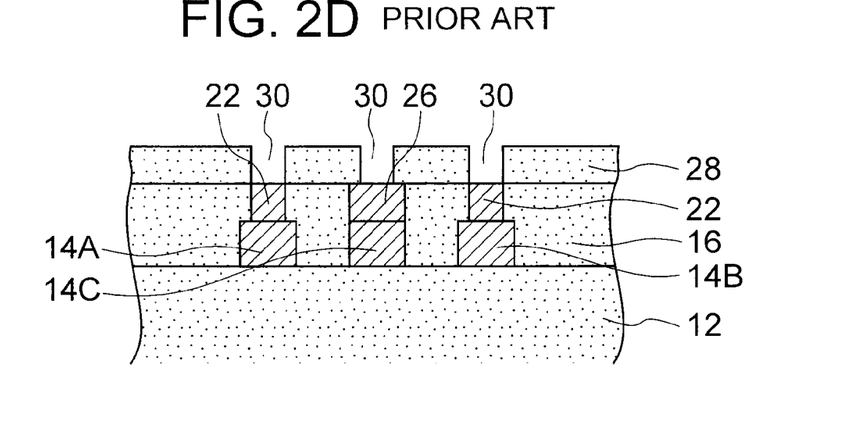

Then, as shown in FIG. 2D, a second interlayer dielectric film 28 is deposited on the entire surface of the wafer and etched to form via-holes 30 reaching to the via-holes 22 or the bottom interconnect 26.

Figure 2E:
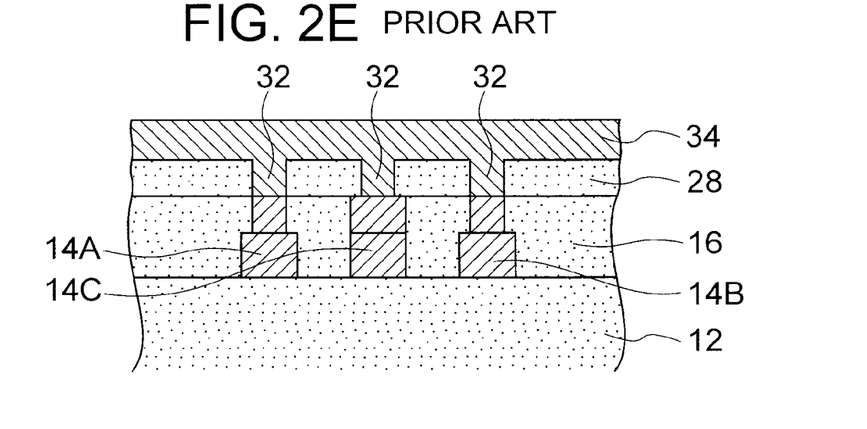

Then, as shown in FIG. 2E, an interconnect material is deposited on the entire surface of the wafer by evaporation to fill the via-holes 30 to form via-holes 32 and a top interconnect layer 34.

Figure 2F:
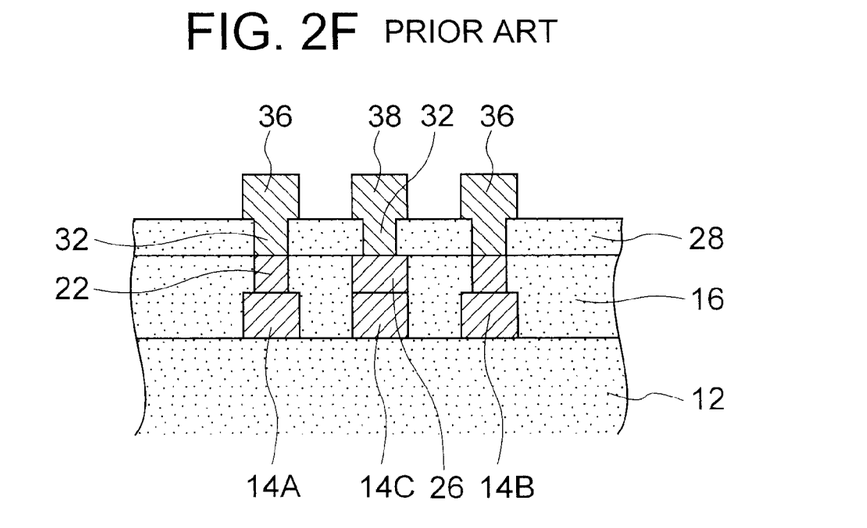

Thereafter, as shown in FIG. 2F, the top interconnect layer 34 is etched to form top interconnects 36 connected to the bottom interconnects 14A and 14B by way of the via-holes 22, and a top interconnect 38 connected to the bottom interconnect 26 by way of the via-hole 32, thereby providing a desired multi-layer interconnection structure.

In the above conventional method, the number of the deposition steps of the interconnect material by using an evaporation technique is two, that is, the evaporation for the bottom interconnect 14 and the via-holes 22/the upper layer of the bottom interconnect 26, and the number of the photolithographic steps of is three, that is, the patterning of the bottom interconnect 14 and opening formations for the first and the second interlayer dielectric films 16 and 28 during the formation of the bottom interconnects having the different film thicknesses. Accordingly, the conventional method includes the large number of the complicated steps.

The thick interconnect of the above configuration has the two-layered structure including the lower layer and the upper layer, and the position adjustment between the layers is difficult.

SUMMARY OF THE INVENTION

In view of the foregoing, an object of the present invention is to provide a multi-layer interconnection structure in a semiconductor device which can optimize a parasitic capacitance and a parasitic resistance depending on demands on a circuit operation and an interconnect length and the method for fabricating the same.

The present invention provides, in a first aspect thereof, a multi-layer interconnection structure in a semiconductor device including: a substrate, a first interlayer dielectric film overlying said substrate, a plurality of first interconnects embedded in said first interlevel dielectric film and each having a top surface substantially flush with a top surface of said first interlayer dielectric film; a second interlayer dielectric film formed on said first interlayer dielectric film and on said first interconnects; a plurality of second interconnects embedded in said second interlayer dielectric film, one of said second interconnects having a thickness larger than a thickness of another of said second interconnects, said one of said second interconnects having a length larger than a length of said another of said second interconnects or constituting a critical path for a circuit operation of said semiconductor device.

The present invention provides, in a second aspect thereof, a method for fabricating an interconnection structure in a semiconductor device including the steps of: forming a plurality of first interconnects embedded in a first interlayer dielectric film overlying a substrate, each of said first interconnects having a top surface substantially flush with a top surface of said first interlayer dielectric film; forming a second interlayer dielectric film having a first thickness on said first interlayer dielectric film, forming a first etch stop film on said second interlayer dielectric film at a specified location; forming a third interlayer dielectric film having a second thickness on said second interlayer dielectric film and said first etch stop film; etching said second and third interlayer dielectric films to form a first trench having a thickness substantially equal to a sum of said first thickness and said second thickness, a second trench having said second thickness, a third trench having a bottom on said etch stopper and a via-hole having said first thickness and communicated with said second trench; and forming a plurality of second interconnects by filling said first trench, said via-hole, said second trench and said third trench.

In accordance with the first and second aspects of the present invention, the semiconductor device having the multi-layer interconnection structure can be realized having the optimized parasitic capacitance and parasitic resistance depending on the demand on the circuit operation and the interconnect length. In accordance with the manufacturing method, the semiconductor device can be easily and economically obtained.

The above and other objects, features and advantages of the present invention will be more apparent from the following description.

PREFERRED EMBODIMENTS OF THE INVENTION

Now, the present invention is more specifically described with reference to accompanying drawings.

First Embodiment

Figure 3:
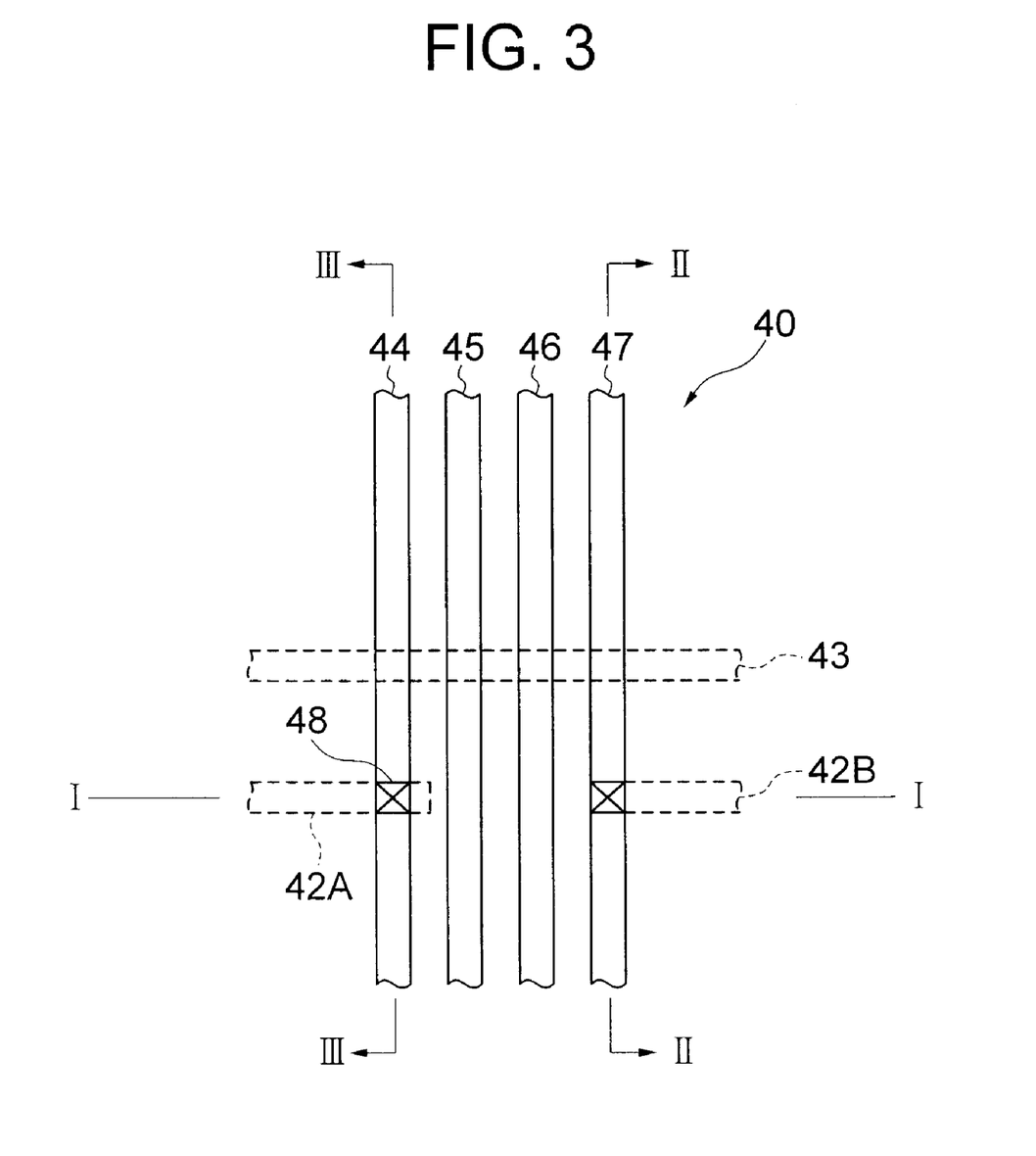
FIG. 3 is a top plan view showing a multi-layer interconnection structure of a semiconductor device in accordance with an embodiment of the present invention.

A multi-layer interconnection structure 40 of a semiconductor device in accordance with a first embodiment of the present invention is, as shown in FIG. 3, a two-layered interconnection structure including two copper-based bottom (first) interconnects 42 and 43, and four copper-based top (second) interconnects 44, 45, 46 and 47 overlying the bottom interconnects 42 and 43 and perpendicular thereto.

The configuration of the top and bottom interconnects is not especially restricted. At least part of the top interconnects may extend in a direction crossing with the bottom interconnects, or perpendicular to the bottom interconnects. When the first top interconnect crosses the bottom interconnect not connected thereto, the first top interconnect has, at a crossing point, a thickness thinner than that of another point. The bottom interconnects may also have different thicknesses in a single layer. The conductive material used for the top and bottom interconnects is not especially restricted.

The bottom interconnects 42 and 43 have substantially the same film thickness, and the bottom interconnect 42 is divided into a left portion 42A and a right portion 42B as shown in FIG. 3. The left portion 42A is connected to a top interconnect 44 by way of a via-hole 48, and the right portion 42B is directly connected to a top interconnect 47.

The top interconnects 46 and 47 are thicker among the top interconnects 44 to 47. For example, the thickness of the top interconnects 46 and 47 is between 1.0 and 2.0 μm, and that of the top interconnects 44 and 45 is between 0.5 and 1.0 μm.

Figure 4:
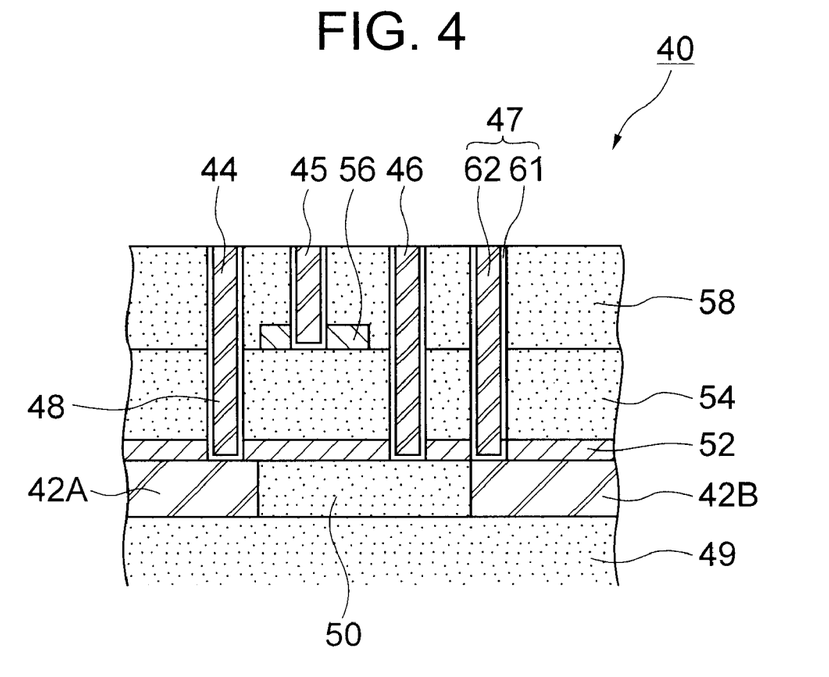
FIG. 4 is a longitudinal sectional view taken along a line I—I of FIG. 3.
Figure 5:
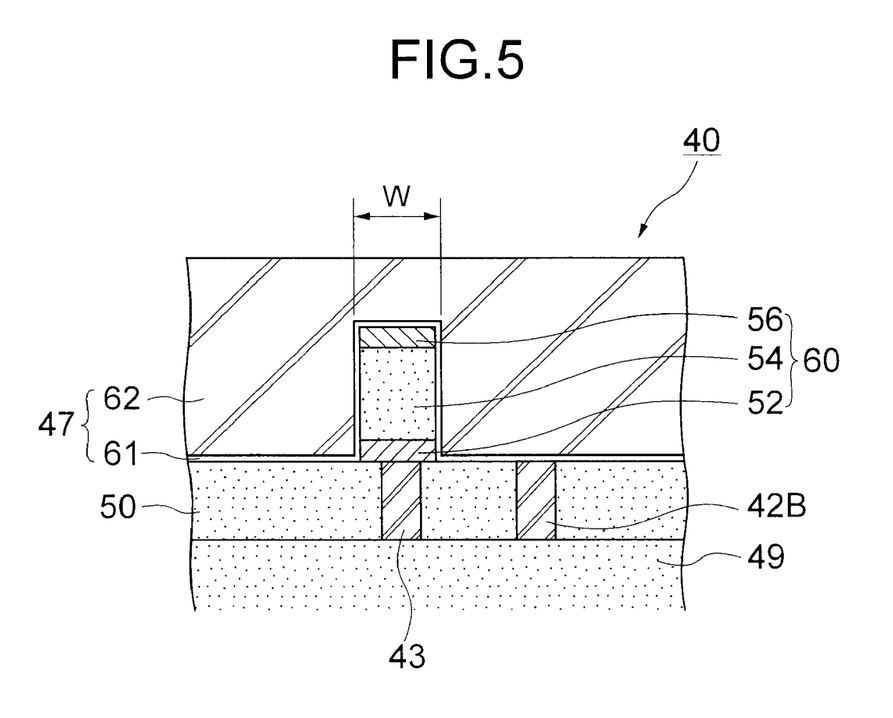
FIG. 5 is a longitudinal sectional view taken along a line II—II of FIG. 3.

As shown in FIG. 5, the multi-layer interconnection structure of the first embodiment is formed on a dielectric film 49, and includes the divided portions 42A and 42B of the bottom interconnect having a thickness between 0.5 and 1.0 μm embedded in a first interlayer dielectric film 50 disposed on the dielectric film 49 as shown in FIG. 4.

The multi-layer interconnection structure 40 further includes a plasma nitride film 52, a second interlayer dielectric film 54 made of a plasma SiO$_2$ film, a plasma SiON film 56 and a third interlayer dielectric film 58 made of a plasma SiO$_2$ film, sequentially formed on the bottom interconnects 42A and 42B and the first interlayer dielectric film 50.

The top interconnect 44 is embedded in an interconnect trench penetrating the third interlayer dielectric film 58 to reach to the second interlayer dielectric film 54, and is connected to the bottom interconnect 42A by way of the via-hole 48 formed by filling the via-hole penetrating the second interlayer dielectric film 54 and the plasma nitride film 52 to reach to the bottom interconnect 42A.

The top interconnect 45 not connected to the bottom interconnect is a passing top interconnect and is embedded in an interconnect trench penetrating the third interlayer dielectric film 58 and the plasma SiON film 56 to reach to the second interlayer dielectric film 54.

The top interconnect 46 not connected to the bottom interconnect is a passing top interconnect and is embedded in an interconnect trench penetrating the third interlayer dielectric film 58, the second interlayer dielectric film 54 and the plasma nitride film 52 to reach to the first interlayer dielectric film 50.

The top interconnect 47 is embedded in an interconnect trench penetrating the third interlayer dielectric film 58, the second interlayer dielectric film 54 and the plasma nitride film 52 to reach to the bottom interconnect 42B, and is electrically connected to and in direct contact with the bottom interconnect 42B.

The plasma nitride film 52 is a plasma SiN film having a thickness between 0.02 and 0.2 μm and acts as a copper cap film for preventing the copper diffusion in the copper-based bottom interconnects 42 and 43.

The sum of the thicknesses of the plasma nitride film 52 and the second interlayer dielectric film 54 substantially equals to the difference between the thicknesses of the top interconnects 46 and 47 and the top interconnects 44 and 45.

The plasma SiON film 56 has a thickness between 0.02 and 0.2 μm, and acts as an etch-stopper, as described later, for forming the interconnect trench for embedding the top interconnect 45.

The top interconnect 47 is connected only to the bottom interconnect 42B. Accordingly, as shown in FIG. 5, the top interconnect 47 is electrically separated from the bottom interconnect 43 by a dielectric layer 60 on the bottom interconnect 43 at the intersection between the top interconnect 47 and the bottom interconnect 43.

The dielectric layer 60 has a three-layered structure including the plasma nitride film 52, the second interlayer dielectric film 54 and the plasma SiON film 56, has a width "W" about 2 to 10 times the interconnect width of the bottom interconnect 43, and extends in a direction perpendicular to bottom interconnects 42 and 43 in a length about 2 to 10 times the interconnect width of the top interconnect 47.

The top interconnect 46 is, similarly to the top interconnect 47, electrically separated from the bottom interconnect 43 by a dielectric film 60 on the bottom interconnect 43.

Figure 6:
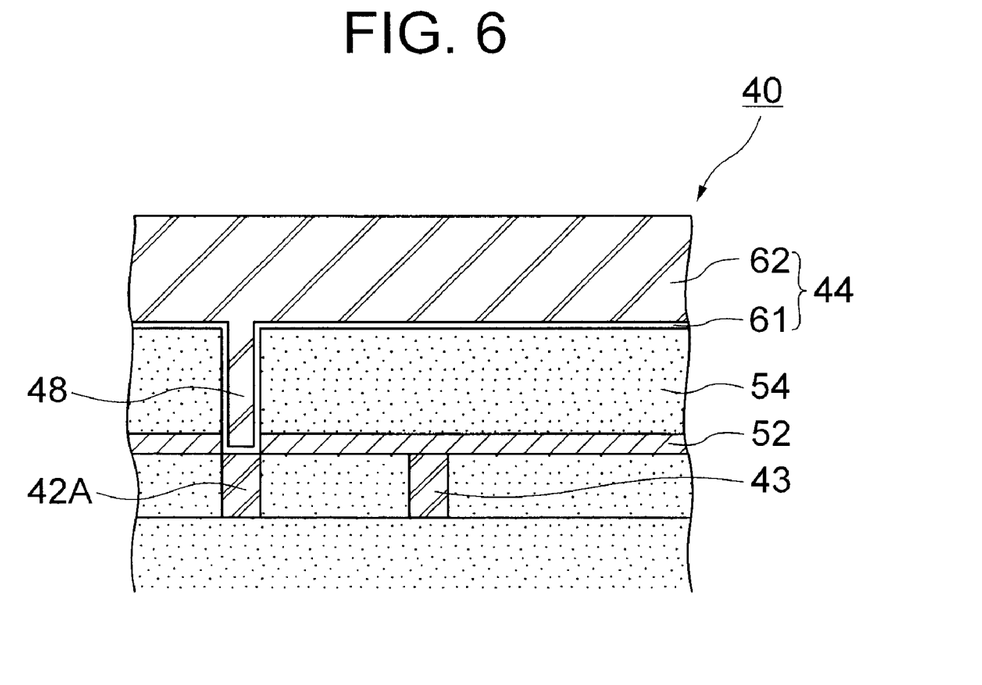
FIG. 6 is a longitudinal sectional view taken along a line III—III of FIG. 3.

The top interconnect 44 is, as shown in FIG. 6, connected to the bottom interconnect 42A by way of the via-hole 48, and is separated from the bottom interconnect 43 by the plasma nitride film 52 and the second interlayer dielectric film 54.

The respective top interconnects 44, 45, 46 and 47 include a multi-layer barrier metal layer 61 made of TaN (20 nm)/Ta (20 nm) and a copper layer 62. The interconnect material of these top interconnects may be a tungsten-based material other than the copper-based material. When the tungsten-based material is used, a TiN film having a thickness of 50 nm is deposited as the barrier metal layer 61 and a tungsten layer is deposited by a CVD method using a WF$_6$-based gas.

In the semiconductor device of the present embodiment having the above configuration, the parasitic capacitance and the parasitic resistance cab be optimized by changing the interconnect film thicknesses of the top interconnects 44 to 47 depending on the demand on the circuit operation and the interconnect length in the single interconnect layer.

Figure 7:
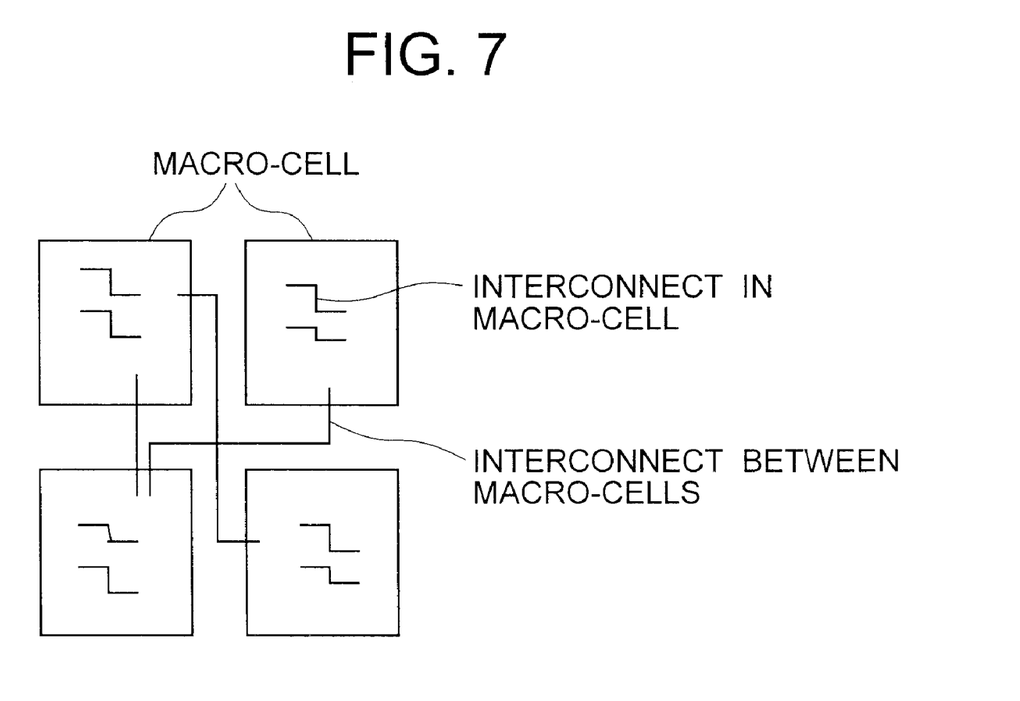
FIG. 7 is an exemplified diagram showing a plurality of macro-cells in accordance with the embodiment.

As shown in FIG. 7, the interconnect film thickness in macro-cells is thin and that between the macro-cells is thick to optimize the interconnect design of the semiconductor device of the embodiment.

Modified Embodiment

The following combinations of the etch-stopper, the dielectric film and the interlayer dielectric film for the multi-layer structure 40 shown in Table 2 can be used in addition to the combination exemplified in the first embodiment. In the Table 2, HSQ is an abbreviation of "Hydrogen Silsesquioxane", and an organic dielectric film includes MSQ (Methyl Silsesquioxne), BCB (Benzo-Cyclo-Buten), organic resin (organic polymer) and a-C:F.

TABLE 2

| Etch-Stopper | Dielectric Film | Interlayer Dielectric Film |
| --- | --- | --- |
| Plasma SiON | HSQ | HSQ |
| Plasma SiO$_2$ | Organic Dielectric Film | Organic Dielectric Film |
| Plasma SiO$_2$ | Plasma SiO$_2$ | Organic Dielectric Film |

Embodiment for Manufacture

Manufacture of the semiconductor device having the multi-layer interconnection structure 40 of the first embodiment will be described referring to FIGS. 8A to 8F.

Figure 8A:
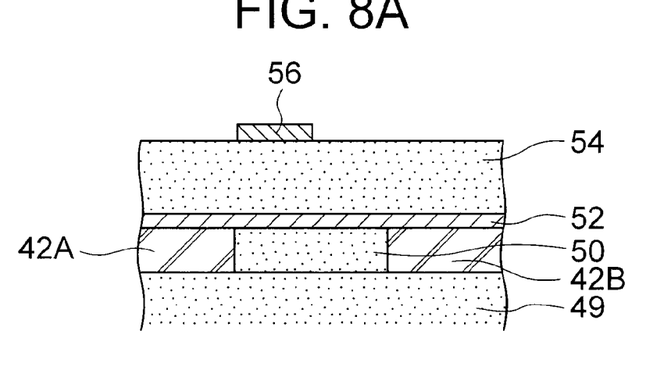
FIGS. 8A to 8F are longitudinal sectional views sequentially showing a method for manufacturing a semiconductor device in accordance with the embodiment of the present invention.

At first, as shown in FIG. 8A, the plasma nitride film 52 having a thickness of between 0.02 and 0.2 μm, the second interlayer dielectric film 54 made of the plasma SiO$_2$ film, the plasma SiON film having a thickness of between 0.02 and 0.2 μm are sequentially formed, by using a plasma CVD method, on the bottom interconnects 42A and 42B embedded in the first interlayer dielectric film 50 on the dielectric film 49.

Then, the belt-like etch-stopper 56 is patterned in an interconnect trench region of the top interconnect by etching the plasma SiON film. The etch-stopper 56 extends in a direction perpendicular to the bottom interconnects 42A and 42B and has a width "W" larger than about twice that of the top interconnect 45 and smaller than an interval between interconnect trenches 64 and 66 of the top interconnects 44 and 46.

Figure 8B:
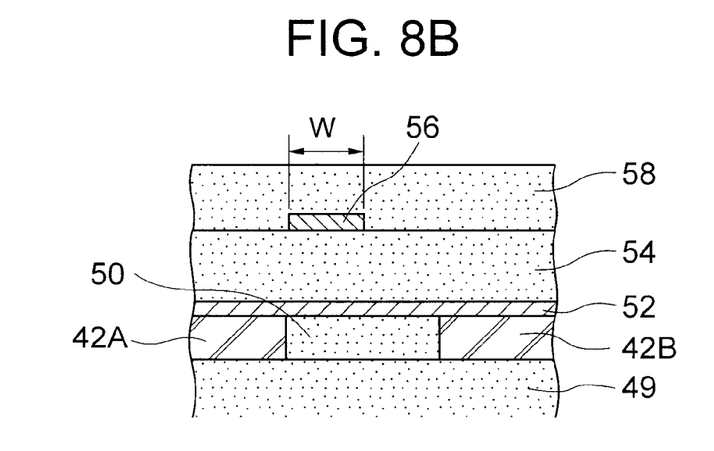

Then, as shown in FIG. 8B, the third interlayer dielectric film 58 is deposited on the second interlayer dielectric film 54 and the etch-stopper 56 by using the plasma CVD method. The film thickness of the third interlayer dielectric film 58 is substantially the same as those of the top interconnects 44 and 45.

Figure 8C:
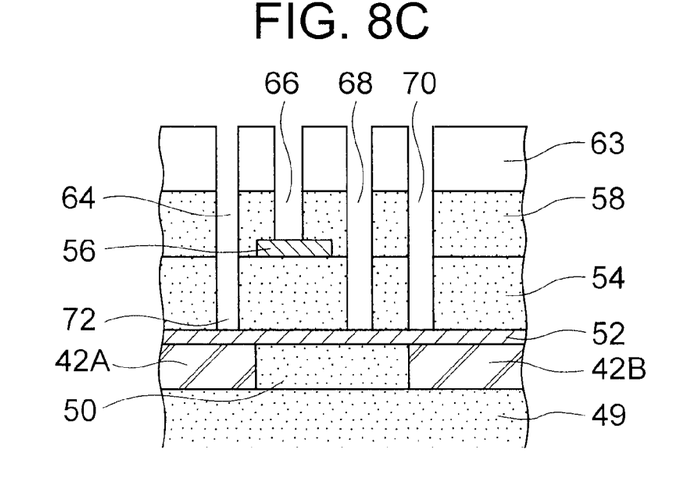

Then, as shown in FIG. 8C, a photoresist film (etching mask) 63 is formed on the third interlayer dielectric film 58, and the respective interconnect trenches 64, 66, 68 and 70 and an via-hole 72 are formed by using a dual-damascenel method.

The dual-damascenel method is basically conducted by depositing the interlayer dielectric layer overlying the bottom interconnects, forming the via-hole in the interlayer dielectric layer for connecting the trench for the top interconnect and the bottom interconnects with the top interconnect, and filling the trench for the top interconnect and the via-hole with the conductive material to form the top interconnect and the via-hole.

The interconnect trench pattern of the etching mask 63 for embedding the top interconnects 44 to 47 has a width of 0.3 μm and an interval of 0.3 μm.

In the embodiment, the third interlayer dielectric film 58 is etched by using the etching mask 63 in the etching step to form the interconnect trench 66 reaching to the etch-stopper 56. Together with the interconnect trench 66, the interconnect trenches 64, 68 and 70 are simultaneously and halfway formed.

Then, the second interlayer dielectric film 54 is etched to form the via-hole 72 and the interconnect trenches 64, 68 and 70 reaching to the plasma nitride film 52, by using another etching mask which is prepared by transcribing a required via-hole pattern to the etching mask 63.

Figure 8D:
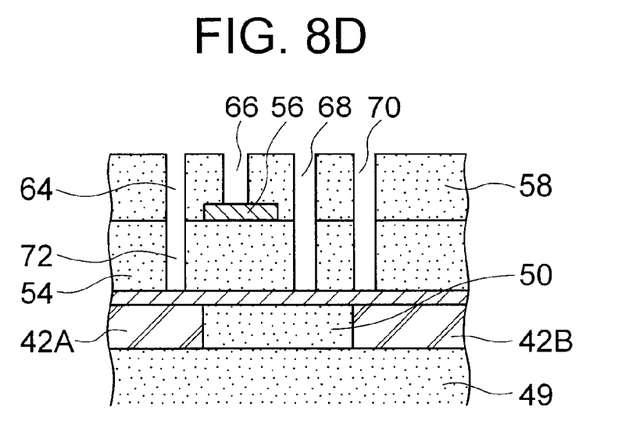

Then, the above another etching mask is removed from the third interlayer dielectric film 58 to expose the third interlayer dielectric film 58 as shown in FIG. 8D.

Figure 8E:
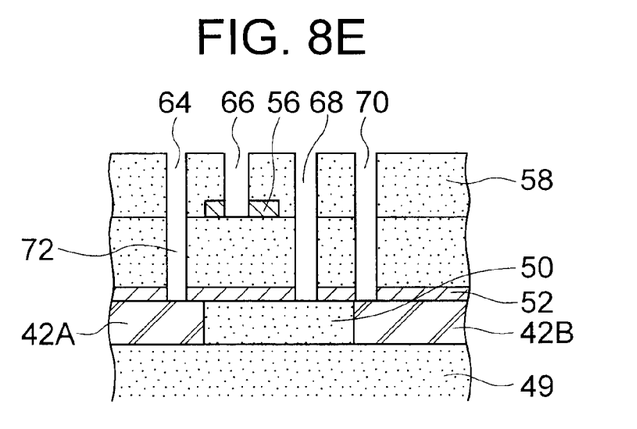

Then, as shown in FIG. 8E, the plasma SiON film 56 and the plasma nitride film 52 are plasma-etched to finish the interconnect trenches 64, 66, 68 and 70 and the via-hole 72 by using the third interlayer dielectric film 58 as the mask.

The conditions for the above etching is, for example, as follows.

Etching Conditions

Pressure in Chamber: 5 to 50 mTorr.

High Frequency Output: 50 to 1000 W

Etchant: CHF$_3$/10 to 50 sccm, Ar/100 to 1000 sccm, O$_2$/5 to 1000 sccm

Then, the multi-layer barrier metal layer 61 made of TaN(20 nm)/Ta(20 nm) is deposited on the walls of the via-hole 72 and the interconnect trenches 64, 66, 68 and 70 by sputtering. A seed copper layer having a thickness of 0.2 μm is deposited by sputtering, and the via-hole 72 and the interconnect trenches 64, 66, 68 and 70 are filled with copper 62 by plating. Finally, the barrier metal layers 61 and the copper 62 on the third interlayer dielectric film 58 are removed by chemical mechanical polishing.

Figure 8F:
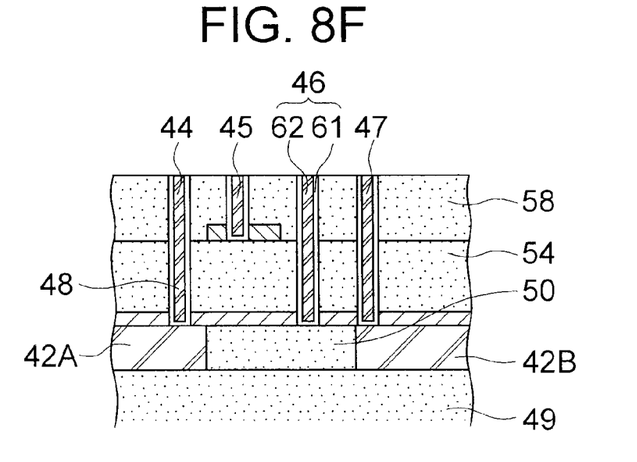

Thereby, as shown in FIG. 8F, the multi-layer interconnection structure is provided including the thin top interconnect 44 connected to the bottom interconnect 42A by way of the via-hole 48, the thin passing top interconnect 45, the thick passing top interconnect 46 and the top interconnect 47 in the direct contact with the bottom interconnect 42B.

Figure 9A:
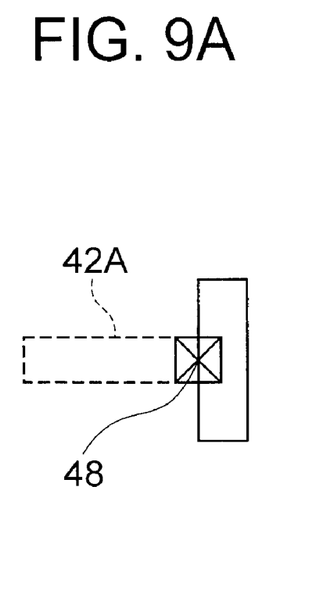
FIGS. 9A and 9B are a top plan view and a longitudinal sectional view, respectively, of a multi-layer interconnection structure in which a via-hole is misaligned.
Figure 9B:
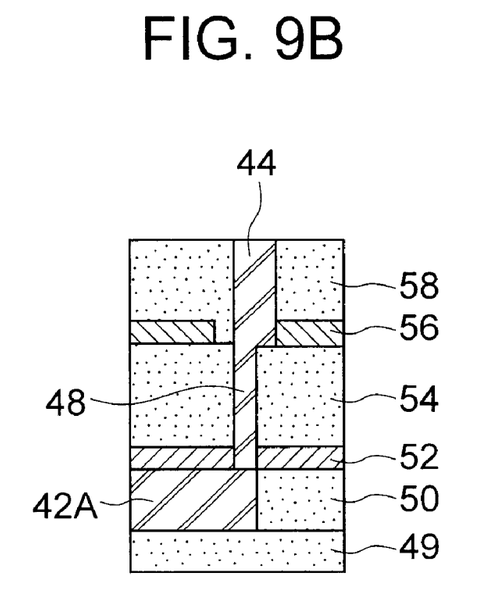
Figure 10A:
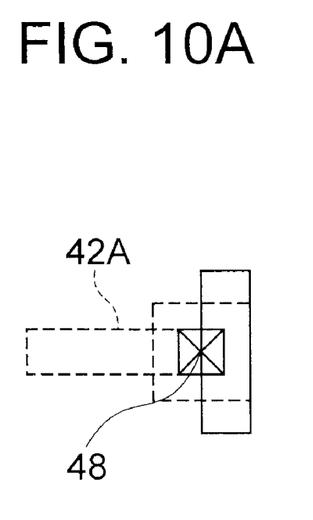
FIGS. 10A and 10B are a top plan view and a longitudinal sectional view, respectively, of a multi-layer interconnection structure in which a via-hole is misaligned.
Figure 10B:
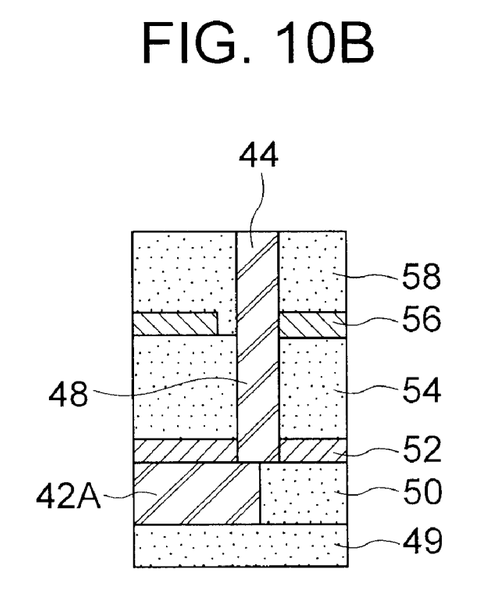

In the manufacture of the semiconductor device, the misalignment may be generated between the via-hole 48 and the top interconnect 44 and between the via-hole 48 and the bottom interconnect 42A. When the width of the via-hole 48 is substantially the same as that of the top interconnect 44 and no margin exists, the relationship is shown in FIGS. 9A and 9B among the via-hole 48 and the top and the bottom interconnects 44 and 42A after the via-hole 48 is shifted in a right-hand direction. When the via-hole 48 has a margin with respect to the top and the bottom interconnects 44 and 42A, the relationship direction is shown in FIGS. 10A and 10B among the via-hole 48 and the top and the bottom interconnects 44 and 42A after the via-hole 48 is shifted in a right-hand direction. The via-hole shown in FIGS. 10A and 10B has a smaller resistance and a higher resistance against electromigration than that shown in FIGS. 9A and 9B.

Since the above embodiments are described only for examples, the present invention is not limited to the above embodiments and various modifications or alternations can be easily made therefrom by those skilled in the art without departing from the scope of the present invention.

What is claimed is:

1. A multi-layer interconnection structure in a semiconductor device comprising:

a substrate;

a first interlayer dielectric film overlying said substrate;

a plurality of first interconnects embedded in said first interlayer dielectric film and having a first orientation in a plan view, each of said plurality of first interconnects having a top surface substantially flush with a top surface of said first interlayer dielectric film;

a second interlayer dielectric film formed on said first interlayer dielectric film and on said plurality of first interconnects;

a third interlayer dielectric film formed on said second interlayer dielectric film; and a plurality of second interconnects embedded in at least said third interlayer dielectric film and having a second orientation in said plan view that crosses said first orientation, a portion of said plurality of second interconnects having a uniform thickness and a remaining portion of said plurality of second interconnects having a nonuniform thickness.

2. The multi-layer interconnection structure as defined in claim 1, wherein each of said remaining portion of said plurality of said second interconnects has a length, a part of said length being embedded in said third interlayer dielectric film and said second interlayer dielectric film and another part of said length being embedded in said third interlayer dielectric film, and at least one of said remaining portion of said plurality of said second interconnects is connected to one of said plurality of said first interconnected along said part of said length at a corresponding crossing point.

3. The multi-layer interconnection structure as defined in claim 1, wherein said connection has a dual-damascenel structure.

4. The multi-layer interconnection structure as defined in claim 1, wherein said via-hole has a height substantially equal to a difference between a thickness of one of said portion of said plurality of second interconnects embedded in said third layer and a thickness of one of said remaining portion of said plurality of second interconnects embedded in said third layer and said second layer.

5. The multi-layer interconnection structure as defined in claim 2, wherein at least one of said remaining portion of said plurality of second interconnects crosses one of said plurality of first interconnect at a corresponding crossing point with said another part of said length and said another part of said length is insulated from said one of said plurality of first interconnects by said second interlayer dielectric film.

6. The multi-layer interconnection structure as defined in claim 1, wherein one of said remaining portion of said plurality of second interconnects is longer than any one of said portion of said plurality of second interconnects.

7. The multi-layer interconnection structure as defined in claim 1, wherein at least one of said portion of said plurality of second interconnects forms a connection to one of said plurality of first interconnects by a via hole at a corresponding crossing point.

8. The multi-layer interconnection structure as defined in claim 1, wherein said first orientation and said second orientation are substantially orthogonal, so as to form a grid in a plan view of said first interconnects and said second interconnects.

9. The multi-layer interconnection structure as defined in claim 1, wherein a portion of said plurality of first interconnects is of a continuous length and a remaining portion is of a discontinuous length.

10. The multi-layer interconnection structure as defined in claim 1, wherein at least one of said portion of said plurality of second interconnects embedded in said third layer crosses a corresponding first interconnect at a crossing point and is insulated from said corresponding first interconnect by said second interlayer dielectric film.

11. The multi-layer interconnection structure as defined in claim 5, wherein said part of said length of said remaining portion of said plurality of second interconnects formed in said third layer is wider than a longitudinal cross-section of said corresponding first interconnect.

* * * * *